United States Patent [19]
Gerstner

[11] Patent Number: 5,220,724
[45] Date of Patent: Jun. 22, 1993

[54] METHOD OF SECURING SURFACE-MOUNTED DEVICES TO A SUBSTRATE

[75] Inventor: Roland Gerstner, Reutlingen, Fed. Rep. of Germany

[73] Assignee: Robert Bosch GmbH, Stuttgart, Fed. Rep. of Germany

[21] Appl. No.: 756,490

[22] Filed: Sep. 9, 1991

[30] Foreign Application Priority Data

Sep. 8, 1990 [DE] Fed. Rep. of Germany ....... 4028556

[51] Int. Cl.[5] .............................................. H05K 3/34
[52] U.S. Cl. .................................... 29/840; 29/832; 206/228; 252/511; 252/514
[58] Field of Search .................. 29/832, 840, 846; 357/80; 252/511, 514; 206/228

[56] References Cited

U.S. PATENT DOCUMENTS

| | | | |
|---|---|---|---|
| 4,208,005 | 6/1980 | Nate et al. | 29/840 X |
| 4,616,413 | 10/1986 | Iliov et al. | 29/832 |
| 4,617,729 | 10/1986 | Celnik | 29/840 |
| 4,654,752 | 3/1987 | Kyle | 29/840 X |
| 4,667,401 | 5/1987 | Clements et al. | 29/840 X |
| 4,694,572 | 9/1987 | Leber et al. | 29/840 |
| 4,811,081 | 3/1989 | Lyden | 357/80 |
| 4,820,446 | 4/1989 | Prud'Homme | 252/511 |
| 4,856,185 | 8/1989 | Baumgartner | 29/840 |
| 4,994,207 | 2/1991 | Edelman et al. | 252/514 |
| 5,002,818 | 3/1991 | Licari et al. | 206/228 X |

FOREIGN PATENT DOCUMENTS 330113 8/1989 European Pat. Off. .
3800136 7/1989 Fed. Rep. of Germany .
2186427 8/1987 United Kingdom .

OTHER PUBLICATIONS

Derwent WPI Abstract of DE-OS 38 00 136.
Byron C. Sakiadis et al., DuPont Company, "Thermal Stress Reduction Via Thermoplastic Die-Attach Adhesive", in *Microelectronic Manufacturing & Testing*, Jun. 1988, pp. 9-10.
L. Ying, "A Reworkable High Reliability Thermoplastic Die Attach Adhesive", *Proceedings of the 1986 International Symposium on Microelectronics*, sponsored by the International Society for Hybrid Microelectronics, Reston Va., Oct. 1986.
Henkel Corporation, Adhesives & Industrial Resins Division, information sheet of Macromelt 6208 Thermoplastic polyamide adhesive (one page, undated).

Primary Examiner—Carl J. Arbes
Attorney, Agent, or Firm—Frishauf, Holtz, Goodman & Woodward

[57] ABSTRACT

A method for mounting Surface-Mounted-Devices ("SMD's") on a substrate, e.g. a PC board, involves warming an adhesive containing conductive particles from a room-temperature solid state to a warmed fluid state, applying said fluid adhesive to the substrate, permitting the adhesive to cool back into a solid state, subsequently warming the substrate and adhesive to render the adhesive tacky and yielding, mounting the components (2-5) in the tacky adhesive, and permitting the adhesive to cool back into a solid state, thereby securing the components on the substrate.

8 Claims, 1 Drawing Sheet

METHOD OF SECURING SURFACE-MOUNTED DEVICES TO A SUBSTRATE

Cross-Reference to related patent, the disclosure of which is incorporated by reference:
U.S. Pat. No. 4,856,185, BAUMGARTNER et al./SIEMENS AG.
Cross-Reference to related literature:
L. Ying, "A Reworkable High Reliability Thermoplastic Die Attach Adhesive", *Proceedings of the 1986 Int'l Symposium on Microelectronics,* sponsored by the Int'l Society for Hybrid Microelectronics, Reston Va., Oct. 1986.
Byron C. Sakiadis et al., DuPont Company, "Thermal Stress Reduction Via Thermoplastic Die-Attach Adhesive", in *Microelectronic Manufacturing & Testing,* June 1988, pp. 9–10.
HENKEL Inc. literature on adhesive no. 6208.

FIELD OF THE INVENTION

The present invention relates generally to a method of mounting surface-mounted devices (SMD's) on a substrate and, more particularly, to an improved method which is compatible with mass-production soldering techniques.

BACKGROUND

It is already known to use an epoxy-based conductive adhesive to electrically connect the terminals of the components to conductive tracks, e.g. on a printed circuit board. For this purpose, the fluid adhesive is applied by screen printing, the components are stuck into the tacky adhesive, and the adhesive is subsequently cured, for example at 150 degrees Celsius. This has the disadvantage that only a limited time, dependent upon the hardening time of the adhesive, may be permitted to elapse between the application of the adhesive and the placement of the components. Furthermore, once the adhesive has hardened on them, components can only be removed by mechanically prying them out, possibly assisted by temperature, e.g. heating the adhesive. This involves a risk that the substrate and/or nearby components will be damaged.

In the case of hybrid technology circuits, in which one fraction of the electronic components are adhered and the rest are soldered in place, this method can no longer be used, since one begins with solder paste printed onto the substrate, and subsequent screen printing of conductive adhesive smears the solder paste.

It is also known, from an article in the journal *Microelectronic Manufacturing and Testing,* June 1988, entitled "Thermal Stress Reduction Via Thermoplastic Die-Attach Adhesive" to use a meltable adhesive for assembly of integrated circuits (IC's). However, it is not applied as a fluid, but rather in solid form as flakes and only then melted onto the substrate. This has the disadvantage that, for each IC, the adhesive flake must be individually positioned.

The aforementioned I.S.H.M. article, "A Reworkable High Reliability Thermoplastic Die Attach Adhesive", teaches a method according to which the screen-printed adhesive can be dissolved in a solvent, the solvent subsequently being evaporated.

THE INVENTION

The present invention, using a reworkable thermoplastic adhesive, has the advantage that, even in the case of hybrid technology circuits, the meltable adhesive can be applied by screen printing. Since the adhesive is applied in a first step and is no longer sticky after a cooling phase, a solder paste can be subsequently printed without problems.

A further advantage is the fact that swapping out of defective components can be accomplished by simple substrate warming without any problems.

Yet another advantage is the possibility to wait an arbitrarily long time between application of the adhesive and mounting of the components, since after the adhesive cools off and solidifies, no conductive particles can wander around.

In addition, a meltable adhesive has the advantage, over an adhesive with a solvent, that the meltable adhesive can be immediately reworked, without the delay that evaporation of a solvent would require. Furthermore, an adhesive without solvent is significantly friendlier to the environment.

DRAWING

FIG. 1 is a cross-sectional view of a substrate bearing a plurality of Surface-Mounted Devices (SMD's) mounted on the substrate.

DETAILED DESCRIPTION

Figure 1:
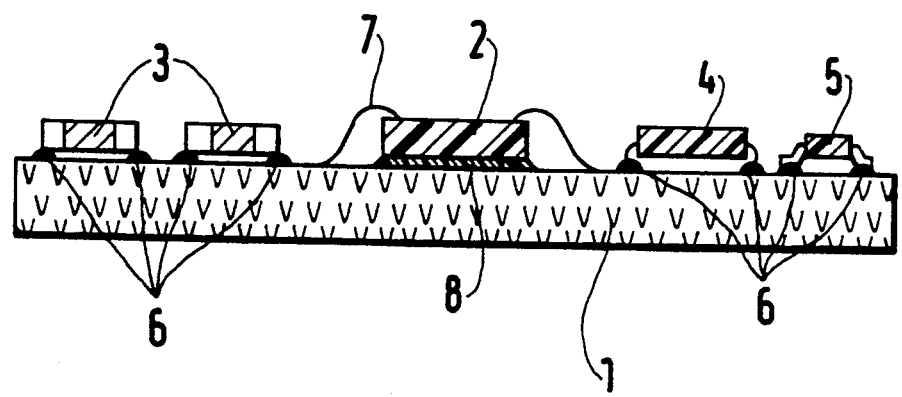

FIG. 1 illustrate a substrate 1 bearing various Surface Mounted Devices, for example, two capacitors 3, a Plastic Lead Chip Carrier (PLCC) 4, a Small Outline (SO) 5, and an Integrated Circuit (IC) 2. These components 2 through 5 are secured to the substrate 1 by various methods. For example, components 3 through 5 are soldered using a solder paste 6, and IC 2 is secured to the substrate by meltable adhesive 8 and electrically connected by bonding wires 7. The meltable adhesive 8 thus forms a ground connection of IC's 2 to the conductive track of substrate 1.

In this hybrid method, first a meltable adhesive, e.g. a polyamide with silver or other conductive particles therein, is screen printed onto substrate 1, the adhesive first being warmed to make it fluid. After a short cooling phase, the adhesive is no longer sticky. One can then, in a next step, print the solder paste 6 onto substrate 1 in the area of the conductive tracks, and can solder in place the solderable components 3 through 5. Finally, the adherable components, e.g. the IC 2, can be mounted, the substrate being warmed in mounting machine so that the meltable adhesive 8 becomes fluid and the components can be set in place. In a short cooling phase, the meltable adhesive hardens the components in place. The components can then be electrically connected to the conductive tracks by the bonding wires 7.

If subsequent repair becomes necessary, the components can be swapped out by simple heating of the substrate and pulling off. In the case of the IC's, new bonding wires must be supplied.

This method of securing SMD components by meltable adhesive can, of course, also be used to secure all components on the substrate and to connect them electrically to the conductive tracks, that is, all connections to the SMD components are made by adhesive.

EXAMPLE

The preferred version of the method of the present invention uses adhesive no. 6208 from the company HENKEL of Germany and of La Grange, Ill. This adhesive is solid at room temperature of 20° C. (68° F.) and liquifies at about 155° C. The method is preferably carried out with the adhesive heated to a temperature in the range 190° to 200° C. The adhesive has a pot time of about 55 seconds.

Screen printing according to the present method is carried out as with any other adhesive which subsequently hardens. The only difference is that the tool, e.g. the screen, for applying the adhesive must be warmed.

Various changes and modifications are possible within the scope of the inventive concept. For example, the adhesive can be applied using a stamp rather than by screen printing. In this case, the stamp must be warmed before it picks up the adhesive.

I claim:

1. Method of securing Surface-Mounted Device components (2) on a substrate (1) using an electrically conductive adhesive (8) applied, by at least one of screen printing and stamping, onto the substrate,
    comprising the steps of providing a solvent-free thermoplastic adhesive consisting of a mixture of polyamide and conductive particles,
    warming said solvent-free thermoplastic adhesive containing said mixture from a room-temperature solid state to a warmed fluid state,
    applying said fluid adhesive to said substrate,
    permitting said adhesive to cool back into a slid state,
    subsequently warming said substrate and adhesive to render said adhesive tacky and yielding,
    mounting said components (2) in said tacky adhesive, and
    permitting said adhesive to cool back into a solid state, thereby securing said components on said substrate.

2. Method according to claim 1,
    wherein said adhesive contains silver particles.

3. Method according to claim 1,
    wherein said adhesive is applied by stamping, using a heated stamp.

4. Method according to claim 1,
    wherein said adhesive is applied by screen printing using a heated screen.

5. Method according to claim 1, wherein
    said adhesive comprises HENKEL adhesive no. 6208.

6. Method of securing Surface-Mounted Device components (2) on a substrate (1) using an electrically conductive adhesive (8) applied, by at least one of screen printing and stamping, onto the substrate,
    comprising the steps of
    warming a solvent-free thermoplastic adhesive containing conductive particles from a room-temperature solid state to a warmed fluid state,
    applying said fluid adhesive to said substrate,
    permitting said adhesive to cool back into a solid state,
    applying a solder paste (6) to said substrate at selected locations, and
    soldering solderable components (3, 4, 5) to said substrate (1) by heating said solder paste;
    subsequently warming said substrate and adhesive to render said adhesive tacky and yielding,
    mounting said (SMD) components (2) in said tacky adhesive, and
    permitting said adhesive to cool back into a solid state, thereby securing said (SMD) components on said substrate.

7. Method of securing Surface-Mounted Device (SMD) components (2) on a substrate (1) using an electrically conductive adhesive (8) applied, by at least one of screen printing and stamping, onto the substrate,
    comprising the steps of
    warming an adhesive containing conductive particles from a room-temperature solid state to a warmed fluid state,
    applying said fluid adhesive to said substrate,
    permitting said adhesive to cool back into a solid state,
    applying a solder paste (6) to said substrate at selected locations, and
    soldering solderable components (3, 4, 5) to said substrate (1) by heating said solder paste,
    subsequently warming said substrate and adhesive to render said adhesive tacky and yielding,
    mounting said SMD components in said tacky adhesive, and
    permitting said adhesive to cool back into a solid state, thereby securing said SMD components (2) on said substrate.

8. Method of securing Surface-Mounted Device components (2) on a substrate (1) using an electrically conductive adhesive (8) applied by stamping onto the substrate.
    comprising the steps of
    warming a solvent-free thermoplastic adhesive containing conductive particles from a room-temperature solid state to a warmed fluid state,
    applying said fluid adhesive to said substrate,
    permitting said adhesive to cool back into a solid state,
    applying a solder paste (6) to said substrate at selected locations, and
    soldering solderable components (3, 4, 5) to said substrate (1) by heating said solder paste;
    subsequently warming said substrate and adhesive to render said adhesive tacky and yielding,
    mounting said (SMD) components (2) in said tacky adhesive, and
    permitting said adhesive to cool back into a solid state, thereby securing said (SMD) components on said substrate.

* * * * *